United States Patent
Yang et al.

(10) Patent No.: US 9,905,808 B2
(45) Date of Patent: Feb. 27, 2018

(54) ORGANIC LIGHT-EMITTING DIODE DISPLAY DEVICE AND ITS MANUFACTURING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/107,051

(22) PCT Filed: Dec. 10, 2015

(86) PCT No.: PCT/CN2015/096970
§ 371 (c)(1),
(2) Date: Jun. 21, 2016

(87) PCT Pub. No.: WO2016/165364
PCT Pub. Date: Oct. 20, 2016

(65) Prior Publication Data
US 2017/0110689 A1    Apr. 20, 2017

(30) Foreign Application Priority Data
Apr. 14, 2015   (CN) .......................... 2015 1 0176671

(51) Int. Cl.
*H01L 51/52*    (2006.01)
*H01L 51/56*    (2006.01)

(52) U.S. Cl.
CPC .......... *H01L 51/5275* (2013.01); *H01L 51/56* (2013.01); *H01L 2251/105* (2013.01); *H01L 2251/5315* (2013.01)

(58) Field of Classification Search
CPC ............................ H01L 51/5275; H01L 51/56
See application file for complete search history.

(56) References Cited

U.S. PATENT DOCUMENTS 6,661,034 B2 * 12/2003 Kawase .............. H01L 51/0014
257/103
9,059,420 B2 * 6/2015 Sato .................... H01L 51/5275
(Continued)

FOREIGN PATENT DOCUMENTS

CN          101271946 A    9/2008
CN          102037580 A    4/2011
(Continued)

OTHER PUBLICATIONS

First Office Action regarding Chinese Application No. 201510176671.8 dated Dec. 7, 2015. Translation provided by Dragon Intellectual Property Law Firm.
(Continued)

*Primary Examiner* — Ida M Soward
(74) *Attorney, Agent, or Firm* — Harness, Dickey & Pierce, P.L.C.

(57) ABSTRACT

The present disclosure provides an OLED display device and its manufacturing method. The OLED display device includes an organic light-emitting layer and a plurality of elements arranged one on another at a light-exiting side of the organic light-emitting layer. At least one transparent light extraction layer is arranged between the elements, and/or between the organic light-emitting layer and the element adjacent to the organic light-emitting layer, and/or at a light-exiting surface of the element farthest away from the organic light-emitting layer. A refractive index of the organic
(Continued)

light-emitting layer and/or a refractive index of the element adjacent to the light extraction layer, and a refractive index of the light extraction layer decrease successively in a light emergent direction, and the refractive index of the light extraction layer is greater than a refractive index of air.

12 Claims, 3 Drawing Sheets

(56) References Cited

U.S. PATENT DOCUMENTS

| | | | |
|---|---|---|---|
| 9,221,214 B2* | 12/2015 | Takahashi | B29C 59/022 |
| 9,246,122 B2* | 1/2016 | Shinotsuka | H01L 51/5225 |
| 9,276,238 B2* | 3/2016 | Shinotsuka | H01L 51/0096 |
| 9,391,299 B2* | 7/2016 | Chien | H01L 51/5268 |
| 9,570,709 B2* | 2/2017 | Lee | H01L 51/0096 |
| 9,614,174 B2* | 4/2017 | Morohashi | H01L 51/5203 |
| 2005/0062399 A1 | 3/2005 | Gotoh et al. | |
| 2010/0072882 A1* | 3/2010 | Hwang | H01L 27/322 313/504 |
| 2015/0001510 A1* | 1/2015 | Yoon | H01L 51/5206 257/40 |
| 2016/0308167 A1* | 10/2016 | Park | H01L 51/5268 |

FOREIGN PATENT DOCUMENTS

| | | |
|---|---|---|
| CN | 102694128 A | 9/2012 |
| CN | 103022081 A | 4/2013 |
| CN | 103185906 A | 7/2013 |
| CN | 103872090 A | 6/2014 |
| CN | 104425720 A | 3/2015 |
| CN | 104795430 A | 7/2015 |
| JP | 2006003562 A | 1/2006 |

OTHER PUBLICATIONS

Third Office Action regarding Chinese Application No. 201510176671.8 dated Jun. 30, 2016. Translation provided by Dragon Intellectual Property Law Firm.

Written Opinion of the International Searching Authority regarding International Application No. PCT/CN2015/096970. Translation provided by Dragon Intellectual Property Law Firm.

* cited by examiner

ORGANIC LIGHT-EMITTING DIODE DISPLAY DEVICE AND ITS MANUFACTURING METHOD

CROSS-REFERENCE TO RELATED APPLICATION APPLICATIONS

This application is the U.S. national phase of PCT Application No. PCT/CN2015/096970 filed on Dec. 10, 2015, which claims priority to Chinese Patent Application No. 201510176671.8 filed on Apr. 14, 2015, the disclosures of which are incorporated in their entirety by reference herein.

TECHNICAL FIELD

The present disclosure relates to the field of display technology, in particular to an organic light-emitting diode (OLED) display device and its manufacturing method.

BACKGROUND

As a self-luminous display device, an OLED display device is free of a backlight source, so it is thin and light. In addition, it also has such advantages as low power consumption, wide viewing angle and high response speed.

Figure 1:
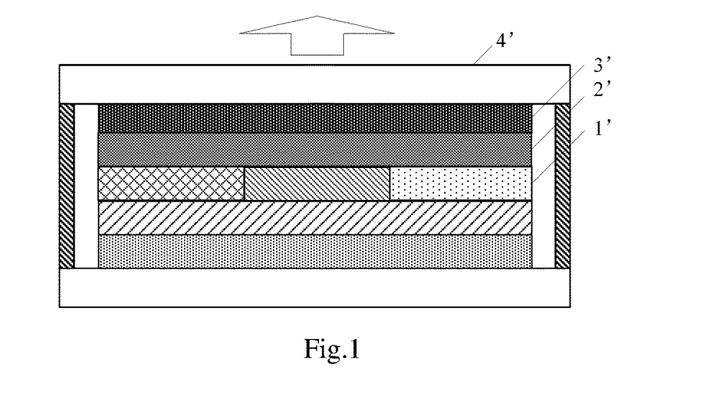
FIG. 1 is a schematic view showing an OLED display device in the related art.

In the related art, the OLED display devices may be classified into a top-emission display device and a bottom-emitting display device, depending on its light emergent directions, and these two kinds of display devices have substantially the same layer structure. As an example, FIG. 1 shows a top-emission OLED display device, which includes an organic light-emitting layer 1', and such elements as an electron transport layer 2', a cathode layer 3' and a cover plate 4' arranged sequentially on the organic light-emitting layer 1'. In use, a light beam from the organic light-emitting layer 1' is transmitted through the electron transport layer 2', the cathode layer 3' and cover plate 4'.

However, the inventor finds that, refractive indices of the organic light-emitting layer 1', the electron transport layer 2', the cathode layer 3' and the cover plate 4' decrease successively, and they are each larger than a refractive index of air. Hence, the light beams from the organic light-emitting layer 1' are transmitted through the elements such as the electron transport layer 2', total reflection may occur for a portion of the light beams at an interface between any two adjacent elements. As a result, the display brightness of the OLED display device will be adversely reduced.

SUMMARY

An object of the present disclosure is to provide an OLED display device and its manufacturing method, so as to improve the display brightness of the OLED display device.

In one aspect, the present disclosure provides in some embodiments an OLED display device, including an organic light-emitting layer and a plurality of elements arranged one on another at a light-exiting side of the organic light-emitting layer. At least one transparent light extraction layer is arranged between the elements, and/or between the organic light-emitting layer and the element adjacent to the organic light-emitting layer, and/or at a light-exiting surface of the element farthest away from the organic light-emitting layer. A refractive index of the organic light-emitting layer and/or a refractive index of the element adjacent to the light extraction layer, and a refractive index of the light extraction layer decrease successively in a light emergent direction, and the refractive index of the light extraction layer is greater than a refractive index of air. At least one of a light-exiting surface and a light-entering surface of each light extraction layer is a rough surface, or the light extraction layers are arranged one on another and at least one of the light-exiting surfaces and the light-entering surfaces of the light extraction layers is a rough surface.

Alternatively, the rough surface is a corrugated surface.

Alternatively, the light extraction layer is made of a photocuring or thermosetting material.

Alternatively, the photocuring material is photocuring resin, and the thermosetting material is thermosetting resin.

Alternatively, the photocuring material includes polymer-dispersed liquid crystals.

Alternatively, the OLED display device is a top-emission display device, and the elements include, in the light emergent direction, an electron transport layer, an electron injection layer, a cathode layer and a first substrate. The light extraction layers are located between the electron transport layer and the electron injection layer, between the electron injection layer and the cathode layer, between the cathode layer and the first substrate, between the organic light-emitting layer and the electron transport layer, and/or at a light-exiting surface of the first substrate.

Alternatively, the OLED display device is a bottom-emission display device, and the elements include, in the light emergent direction, a hole transport layer, a hole injection layer, an anode layer and a second substrate. The light extraction layers are arranged between the hole transport layer and the hole injection layer, between the hole injection layer and the anode layer, between the anode layer and the second substrate, between the organic light-emitting layer and the hole transport layer, and/or at a light-exiting surface of the second substrate.

According to the OLED display device in the at least one embodiment of the present disclosure, the light extraction layers have an identical function at different positions. For ease of description, the light extraction layer arranged between the elements is taken as an example so as to describe the function thereof. Depending on the refraction law, in the case that a light beam enters a medium of a low refractive index from a medium of a high refractive index, a critical angle for the total reflection at an interface therebetween is in direct proportion to the refractive index of the medium of the low refractive index. In the at least one embodiment of the present disclosure, the refractive indices of the light extraction layer and the two elements adjacent to the light extraction layer decrease successively in the light emergent direction, so the refractive index of the light extraction layer is greater than the refractive index of the element at a light-exiting side of the light extraction layer. Thus, in the case that the light beam enters the light extraction layer from the element at a light-entering side of the light extraction layer, a critical angle for the total reflection at an interface therebetween is greater than a critical angle for the total reflection in the case that the light beam directly enters the element at the light-entering side of the light extraction layer. As compared with the related art where the light beam directly enters the element at the light-exiting side of the light extraction layer from the element at the light-entering side of the light extraction layer, in the at least one embodiment of the present disclosure, the light beam from the element at the light-entering side of the light extraction layer enters the light extraction layer and then the element at the light-exiting side of the light extraction layer. In the case that the light beams enter the light extraction layer from the element at the light-entering side of the light extraction layer, the critical angle for the total reflection increases at the interface therebetween, so more light beams may enter the light extraction layer from the element at the light-entering side of the light extraction layer, and thereby more light beams may enter the element at the light-exiting side of the light extraction layer. As a result, it is able to improve the display brightness of the OLED display device.

In another aspect, the present disclosure provides in some embodiments a method for manufacturing an OLED display device, including steps of: forming an organic light-emitting layer; forming a plurality of elements one on another at a light-exiting side of the organic light-emitting layer; and forming at least one transparent light extraction layer between the elements, and/or between the organic light-emitting layer and the element adjacent to the organic light-emitting layer, and/or at a light-exiting surface of the element farthest away from the organic light-emitting layer. A refractive index of the organic light-emitting layer and/or a refractive index of the element adjacent to the light extraction layer, and a refractive index of the light extraction layer decrease successively in a light emergent direction, and the refractive index of the light extraction layer is greater than a refractive index of air.

Alternatively, the step of forming the at least one transparent light extraction layer includes: forming a transparent light extraction layer, forming at least one of a light-exiting surface and a light-entering surface of the light extraction layer into a rough surface through a patterning process, and repeating this step for N−1 times so as to form N light extraction layers, N being a positive integer greater than or equal to 1; or forming N transparent light extraction layers, and forming at least one of the light-exiting surfaces and the light-entering surfaces of one or more of the N transparent light extraction layers into a rough surface through a patterning process, N being a positive integer greater than 1.

Alternatively, the step of forming the transparent light extraction layer and forming at least one of the light-exiting surface and the light-entering surface of the light extraction layer into the rough surface through a patterning process includes: coating a transparent thermosetting material, curing the transparent thermosetting material into the transparent light extraction layer, and impressing at least one of the light-exiting surface and the light-entering surface of the light extraction layer into the rough surface; or coating a transparent photocuring material, curing the transparent photocuring material into the transparent light extraction layer, and forming at least one of the light-exiting surface and the light-entering surface of the light extraction layer into the rough surface through exposing and developing processes.

Alternatively, the step of forming the N transparent light extraction layers and forming at least one of the light-exiting surfaces and the light-entering surfaces of one or more of the N transparent light extraction layers into the rough surface through a patterning process includes: coating a transparent thermosetting material, curing the transparent thermosetting material into the transparent light extraction layer, repeating the coating and curing procedures for N−1 times to form the N transparent light extraction layers, and impressing at least one of the light-exiting surfaces and the light-entering surfaces of one or more of the N transparent light extraction layers into the rough surface; or coating a transparent photocuring material, curing the transparent photocuring material into the transparent light extraction layer, repeating the coating and curing procedures for N−1 times to form the N transparent light extraction layers, and forming at least one of the light-exiting surfaces and the light-entering surfaces of one or more of the N transparent light extraction layers into the rough surface through exposing and developing processes.

Alternatively, during the exposing process, textures on the rough surface are controlled in accordance with an emergent direction of the light beam from a light source, and the emergent direction of the light beam from the light source is controlled in accordance with a structure and a position of a mask plate, or a light path of the light source.

According to the method for manufacturing the OLED display device in the at least one embodiment of the present disclosure, the light extraction layers have an identical function at different positions. For ease of description, the light extraction layer arranged between the elements is taken as an example so as to describe the function thereof. Depending on the refraction law, in the case that a light beam enters a medium of a low refractive index from a medium of a high refractive index, a critical angle for the total reflection at an interface therebetween is in direct proportion to the refractive index of the medium of the low refractive index. In the at least one embodiment of the present disclosure, the refractive indices of the light extraction layer and the two elements adjacent to the light extraction layer decrease successively in the light emergent direction, so the refractive index of the light extraction layer is greater than the refractive index of the element at a light-exiting side of the light extraction layer. Thus, in the case that the light beam enters the light extraction layer from the element at a light-entering side of the light extraction layer, a critical angle for the total reflection at an interface therebetween is greater than a critical angle for the total reflection in the case that the light beam directly enters the element at the light-exiting side of the light extraction layer. As compared with the related art where the light beam directly enters the element at the light-exiting side of the light extraction layer from the element at the light-entering side of the light extraction layer, in the at least one embodiment of the present disclosure, the light beam from the element at the light-entering side of the light extraction layer enters the light extraction layer and then the element at the light-exiting side of the light extraction layer. In the case that the light beams enter the light extraction layer from the element at the light-entering side of the light extraction layer, the critical angle for the total reflection increases at the interface therebetween, so more light beams may enter the light extraction layer from the element at the light-entering side of the light extraction layer, and thereby more light beams may enter the element at the light-exiting side of the light extraction layer. As a result, it is able to improve the display brightness of the OLED display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

REFERENCE SIGN LIST 1 organic light-emitting layer
2 light extraction layer
21 first element
second element
3 electron transport layer
4 electron injection layer
5 cathode layer
6 first substrate
7 hole transport layer
8 hole injection layer
9 anode layer
10 second substrate

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the at least one embodiment of the present disclosure, and based on these embodiments, a person skilled in the art may, without any creative effort, obtain the other embodiments, which also fall within the scope of the present disclosure.

Figure 2:
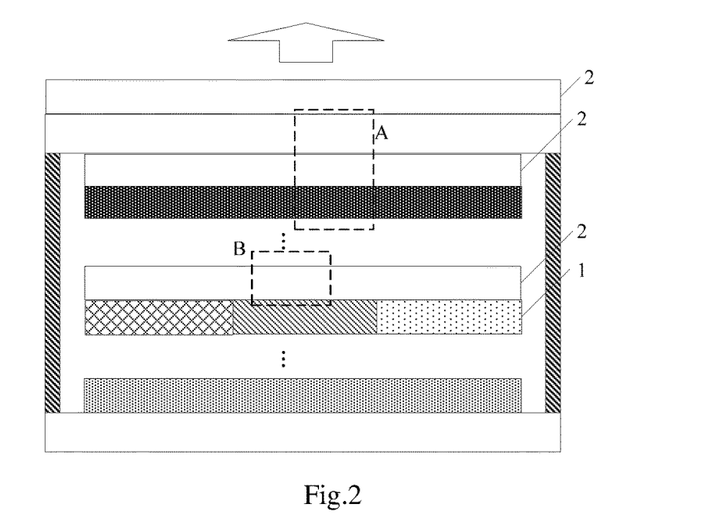
FIG. 2 is a schematic view showing an OLED display device according to at least one embodiment of the present disclosure.
Figure 5:
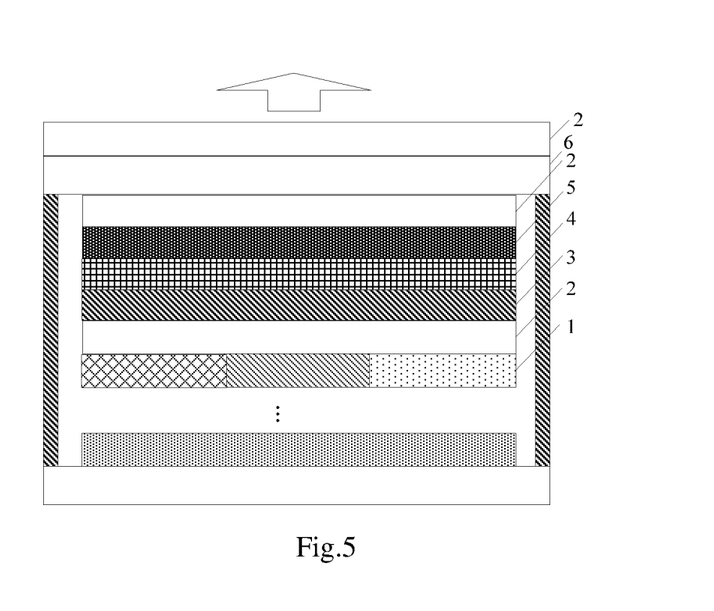
FIG. 5 is a schematic view showing a top-emission display device according to at least one embodiment of the present disclosure.
Figure 6:
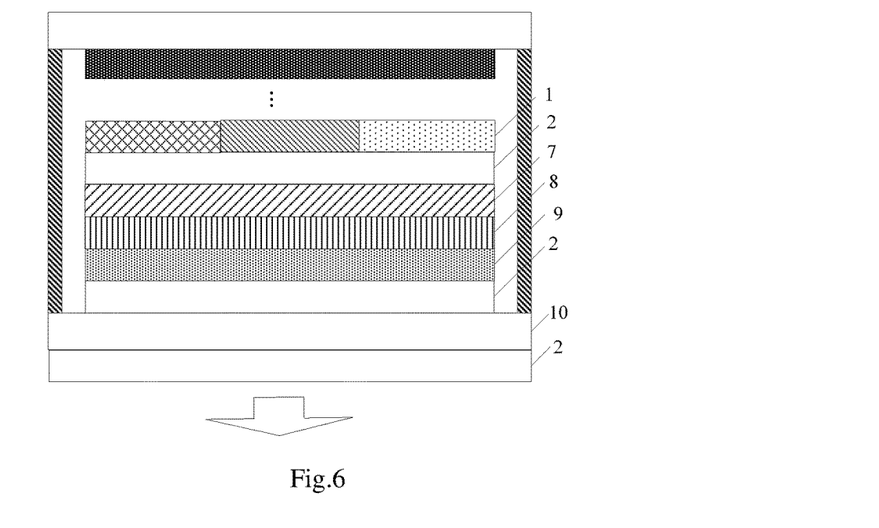
FIG. 6 is a schematic view showing a bottom-emission display device according to at least one embodiment of the present disclosure.

The present disclosure provides in at least one embodiment an OLED display device which, as shown in FIGS. 2, 5, and 6, includes an organic light-emitting layer 1 and a plurality of elements arranged one on another at a light-exiting side of the organic light-emitting layer 1. At least one transparent light extraction layer 2 is arranged between the elements, and/or between the organic light-emitting layer 1 and the element adjacent to the organic light-emitting layer 1, and/or at a light-exiting surface of the element farthest away from the organic light-emitting layer 1. A refractive index of the organic light-emitting layer 1 and/or a refractive index of the element adjacent to the light extraction layer 2, and a refractive index of the light extraction layer 2 decrease successively in a light emergent direction, and the refractive index of the light extraction layer 2 is greater than a refractive index of air. For example, the plurality of elements may include an electron transport layer 3, an electron injection layer 4, a cathode layer 5 and a first substrate 6 as shown in FIG. 5, or the plurality of elements may include a hole transport layer 7, a hole injection layer 8, an anode layer 9 and a second substrate 10 as shown in FIG. 6.

It should be appreciated that, in the at least one embodiment of the present disclosure, the light extraction layers 2 may be arranged in one of the following modes or a combination thereof. The at least one transparent light extraction layer 2 is arranged between the elements, the at least one transparent light extraction layer 2 is arranged between the organic light-emitting layer 1 and the element adjacent to the organic light-emitting layer 1, and the at least one transparent light extraction layer 2 is arranged at the light-exiting surface of the element farthest away from the organic light-emitting layer 1.

It should be further appreciated that, in the case that the refractive index of the organic light-emitting layer 1 and/or the refractive index of the element adjacent to the light extraction layer 2, and the refractive index of the light extraction layer 2 decrease successively in the light emergent direction, there exist the following situations. The refractive indices of the organic light-emitting layer 1, the element adjacent to the light extraction layer 2 and the light extraction layer 2 may decrease successively in the light emergent direction, or the refractive indices of the organic light-emitting layer 1 and the light extraction layer 2 decrease successively in the light emergent direction, or the refractive indices of the element adjacent to the light extraction layer 2 and the light extraction layer 2 decrease successively in the light emergent direction. One of these situations may be selected based on the arrangement of the light extraction layer 2. For example, in the case that the at least one transparent light extraction layer 2 is arranged at the light-exiting surface of the element farthest away from the organic light-emitting layer 1, the refractive indices of the element farthest away from the organic light-emitting layer 1 and the light extraction layer 2 decrease in the light emergent direction, i.e., the refractive indices of the element adjacent to the light extraction layer 2 and the light extraction layer 2 decrease successively in the light emergent direction. For another example, in the case that the at least one transparent light extraction layer 2 is arranged between the organic light-emitting layer 1 and the element adjacent to the organic light-emitting layer 1, the refractive indices of the organic light-emitting layer 1, the element adjacent to the light extraction layer 2 and the light extraction layer 2 decrease successively in the light emergent direction.

Figure 3:
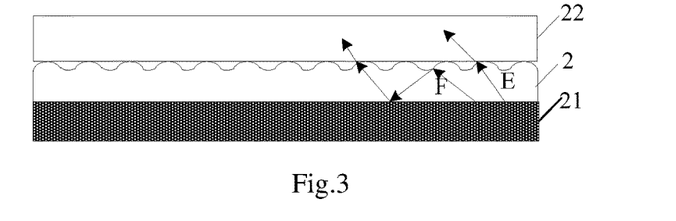
FIG. 3 is an enlarged view of a region A in FIG. 2.

The light extraction layers 2 have an identical function in the above arrangement modes, and the function thereof will be described hereinafter by taking the at least one light extraction layer 2 between the elements as an example. For example, the light extraction layer 2 is arranged between the elements. Depending on the refraction law, in the case that a light beam enters a medium of a low refractive index from a medium of a high refractive index, a critical angle for the total reflection at an interface therebetween is in direct proportion to the refractive index of the medium of the low refractive index. In the at least one at least one embodiment of the present disclosure, the refractive indices of the element adjacent to the light extraction layer 2 and the light extraction layer 2 decrease in the light emergent direction. For example, as shown in FIG. 3, the refractive index of the light extraction layer 2 is n2, a refractive index of a first element 21 at the light-entering side of the light extraction layer 2 is n1, a refractive index of a second element 22 at the light-exiting side of the light extraction layer 2 is n3, and n1>n2>n3. Because the refractive index n2 of the light extraction layer 2 is greater than the refractive index n3 of the second element 22, in the case that the light beam enters the light extraction layer 2 from the first element 21, a critical angle for the total reflection at an interface therebetween is greater than a critical angle for the total reflection in the case that the light beam directly enters the second element 22. As compared with the related art where the light beam directly enters the second element 22 from the first element 21, in the at least one embodiment of the present disclosure, the light beam from the first element 21 enters the light extraction layer 2 and then the second element 22.

The critical angle for the total reflection at the interface from the first element 21 to the light extraction layer 2 is relatively large, so more light beams may enter the light extraction layer 2 from the first element 21, and thereby more light beams may enter the second element 22. As a result, it is able to improve the display brightness of the OLED display device. In the case that the plurality of light extraction layers 2 are arranged among the elements, the function thereof may refer to the above description.

In the at least one embodiment of the present disclosure, at least one of a light-exiting surface and a light-entering surface of each light extraction layer 2 is a rough surface. For example, as shown in FIG. 3, the light-exiting surface of the light extraction layer is a corrugated surface. In the case that the light beams are transmitted at the corrugated surface, there exist at least the following two situations. In a first situation, taking a light beam E as an example, in the case that it arrives at the corrugated surface, its incident angle is less than a critical angle for the total reflection, so it may be transmitted through the corrugated surface and enter the light extraction layer 2. In a second situation, taking a light beam F as an example, in the case that it arrives at the corrugated surface for the first time, its incident angle is greater than a critical angle for the total reflection, so it may be reflected to the light extraction layer 2, and then reflected by an interface between the light extraction layer 2 and the first element 21 at the light-entering side of the light extraction layer 2 toward the corrugated surface again. Due to the effect of the corrugated surface, the light beam F arrives at the corrugated surface in a direction different from a previous direction, and the current incident angle of the light beam F is smaller than the critical angle for the total reflection. At this time, the light beam F may be transmitted through the corrugated surface. As a result, it is able to improve the light transmission, thereby to further improve the display brightness of the display device.

Figure 4:
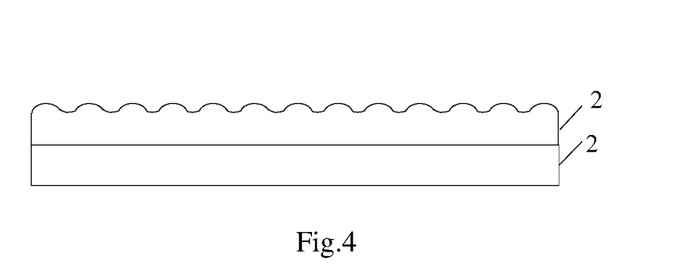
FIG. 4 is an enlarged view of a region B in FIG. 2.

In addition, in the at least one embodiment of the present disclosure, the light extraction layers 2 may be arranged one on another, and at least one of the light-exiting surfaces and the light-entering surfaces of the light extraction layers 2 is a rough surface. In other words, in the case that there are a plurality of light extraction layers 2 arranged one on another, the light-exiting surface and/or the light-entering surface of one of the light extraction layer 2 are rough surfaces, or the light-exiting surfaces and/or the light-entering surfaces of two or more the light extraction layers 2 are rough surfaces. For example, as shown in FIG. 4, two light extraction layers 2 are arranged one on another, and the light-exiting surface of the upper light extraction layer 2 is a corrugated surface. The transmission of the light beams at the corrugated surface may refer to the above descriptions. In addition, after the light beam is transmitted through the rough surface, even diffuse transmission may occur, so it is able to provide the OLED display device with the same display brightness at different viewing angles.

Alternatively, a plurality of light extraction layers 2 are arranged one on another, the light-exiting surfaces and/or the light-entering surfaces of the light extraction layers 2 are rough surfaces. As compared with the situation where the light-exiting surface and/or the light-entering surface of one of the light extraction layers 2 arranged one on another, \are rough surfaces, it is able to improve the light transmission at each of the corrugated surfaces, thereby to further improve the display brightness of the display device.

For example, the light extraction layer 2 may be made of a photocuring material or a thermosetting material. The photocuring material may be photocuring resin and the thermosetting material may be thermosetting resin. The photocuring resin may include polymer-dispersed liquid crystals.

Alternatively, in the above embodiment, as shown in FIG. 5, the OLED display device is a top-emission OLED display device, and the elements include, in the light emergent direction, an electron transport layer 3, an electron injection layer 4, a cathode layer 5 and a first substrate 6. For example, the first substrate 6 is a cover plate. The light extraction layers 2 are located between the electron transport layer 3 and the electron injection layer 4, between the electron injection layer 4 and the cathode layer 5, between the cathode layer 5 and the first substrate 6, between the organic light-emitting layer 1 and the electron transport layer 3, and/or at a light-exiting surface of the first substrate 6.

It should be appreciated that, in the at least one at least one embodiment of the present disclosure, the light extraction layers 2 may be arranged at one or more of a position between the electron transport layer 3 and the electron injection layer 4, a position between the electron injection layer 4 and the cathode layer 5, a position between the cathode layer 5 and the first substrate 6, a position between the organic light-emitting layer 1 and the electron transport layer 3, and a position at the light-exiting surface of the first substrate 6.

The light extraction layers 2 have an identical function at the above positions, and the function thereof will be described hereinafter by taking the light extraction layer 2 between the cathode layer 5 and the first substrate 6 as an example.

As shown in FIG. 5, the transparent light extraction layer 2 is arranged between the cathode layer 5 and the first substrate 6, and refractive indices of the cathode layer 5, the light extraction layer 2 and the first substrate 6 decrease successively, i.e., the refractive index of the light extraction layer 2 is greater than that of the first substrate 6. Depending on the refraction law, in the case that a light beam enters a medium of a low refractive index from a medium of a high refractive index, a critical angle for the total reflection at an interface therebetween is in direct proportion to the refractive index of the medium of the low refractive index. Thus, in the case that the light beam enters the light extraction layer 2 from the cathode layer 5, a critical angle for the total reflection at an interface therebetween is greater than a critical angle for the total reflection in the case that the light beam directly enters the first substrate 6. As compared with the related art where the light beam directly enters the first substrate 6 from the cathode layer 5, in the at least one at least one embodiment of the present disclosure, the light beam from the cathode layer 5 enters the light extraction layer 2 and then the first substrate 6. The critical angle for the total reflection at the interface from the cathode layer 5 to the light extraction layer 2 is relatively large, so more light beams may enter the light extraction layer 2 from the cathode layer 5, and thereby more light beams may enter the first substrate 6. As a result, it is able to improve the display brightness of the OLED display device.

Alternatively, in the above embodiment, as shown in FIG. 6, the OLED display device is a bottom-emission display device, and the elements include, in the light emergent direction, a hole transport layer 7, a hole injection layer 8, an anode layer 9 and a second substrate 10. For example, the second substrate 10 is an array substrate. The light extraction layers 2 are arranged between the hole transport layer 7 and the hole injection layer 8, between the hole injection layer 8 and the anode layer 9, between the anode layer 9 and the second substrate 10, between the organic light-emitting layer 1 and the hole transport layer 7, and/or at a light-exiting surface of the second substrate 10.

It should be appreciated that, in the at least one embodiment of the present disclosure, the light extraction layers 2 may be arranged at one or more of a position between the hole transport layer 7 and the hole injection layer 8, a position between the hole injection layer 8 and the anode layer 9, a position between the anode layer 9 and the second substrate 10, a position between the organic light-emitting layer 1 and the hole transport layer 7, and a position at a light-exiting surface of the second substrate 10.

The light extraction layers 2 have an identical function at the above positions, and the function thereof will be described hereinafter by taking the light extraction layer 2 between the anode layer 9 and the second substrate 10 as an example. As shown in FIG. 6, the transparent light extraction layer 2 is arranged between the anode layer 9 and the second substrate 10, and refractive indices of the anode layer 9, the light extraction layer 2 and the second substrate 10 decrease successively, so that the refractive index of the light extraction layer 2 is greater than that of the second substrate 10. Depending on the refraction law, in the case that a light beam enters a medium of a low refractive index from a medium of a high refractive index, a critical angle for the total reflection at an interface therebetween is in direct proportion to the refractive index of the medium of the low refractive index. Thus, in the case that the light beam enters the light extraction layer 2 from the anode layer 9, a critical angle for the total reflection at an interface therebetween is greater than a critical angle for the total reflection in the case that the light beam directly enters the second substrate 10. As compared with the related art where the light beam directly enters the second substrate 10 from the anode layer 9, in the at least one at least one embodiment of the present disclosure, the light beam from the anode layer 9 enters the light extraction layer 2 and then the second substrate 10. The critical angle for the total reflection at the interface from the anode layer 9 to the light extraction layer 2 is relatively large, so more light beams may enter the light extraction layer 2 from the anode layer 9, and thereby more light beams may enter the second substrate 10. As a result, it is able to improve the display brightness of the OLED display device.

In the at least one embodiment of the present disclosure, the OLED display device further includes a sealant (not shown) for adhering the first substrate 6 to the second substrate 10, so as to prevent such substances as vapor and oxygen from entering the OLED display device, thereby to prolong a service life thereof. In addition, the OLED display device may be any product or member having a display function, e.g., an electronic paper, a mobile phone, a flat-panel computer, a television, a display, a laptop computer or a navigator.

Figure 7:
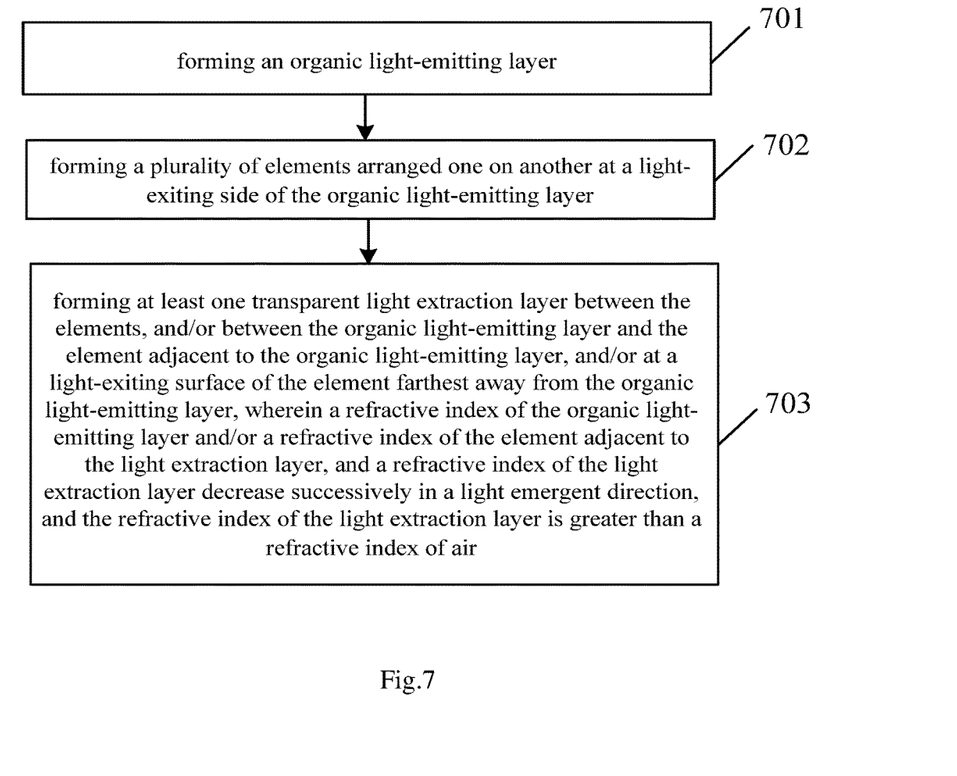
FIG. 7 is a flow chart of a method for manufacturing the OLED display device according to at least one embodiment of the present disclosure.

The present disclosure further provides in at least one embodiment a method for manufacturing an OLED display device which, as shown in FIG. 7, includes the following steps.

Step 701: forming an organic light-emitting layer. For example, the organic light-emitting layer includes a red light-emitting region, a green light-emitting region and a blue light-emitting region. At first, the green light-emitting region and the blue light-emitting region may be shielded by a mask plate, so as to form a red light-emitting layer at the red light-emitting region by evaporation. Next, the red light-emitting layer and the blue light-emitting region may be shielded by the mask plate, so as to form a green light-emitting layer at the green light-emitting region by evaporation. Then, the red light-emitting layer and the green light-emitting layer may be shielded by the mask plate, so as to form the blue light-emitting layer at the blue light-emitting region by evaporation. Through the above steps, it is able to form the organic light-emitting layer.

Step 702: forming a plurality of elements arranged one on another at a light-exiting side of the organic light-emitting layer. For example, the elements may be formed at the light-exiting side of the organic light-emitting layer by evaporation, vapor deposition or ink-jetting.

Step 703: forming at least one transparent light extraction layer between the elements, and/or between the organic light-emitting layer and the element adjacent to the organic light-emitting layer, and/or at a light-exiting surface of the element farthest away from the organic light-emitting layer. A refractive index of the organic light-emitting layer and/or a refractive index of the element adjacent to the light extraction layer, and a refractive index of the light extraction layer decrease successively in a light emergent direction, and the refractive index of the light extraction layer is greater than a refractive index of air.

According to the method for manufacturing the OLED display device in the at least one embodiment of the present disclosure, the light extraction layers have an identical function at different positions. For ease of description, the light extraction layer arranged between the elements is taken as an example to describe the function thereof. Depending on the refraction law, in the case that a light beam enters a medium of a low refractive index from a medium of a high refractive index, a critical angle for the total reflection at an interface therebetween is in direct proportion to the refractive index of the medium of the low refractive index. In the at least one embodiment of the present disclosure, the refractive indices of the light extraction layer and the two elements adjacent to the light extraction layer decrease successively in the light emergent direction, so the refractive index of the light extraction layer is greater than the refractive index of the element at a light-exiting side of the light extraction layer. In the case that the light beam enters the light extraction layer from the element at a light-entering side of the light extraction layer, a critical angle for the total reflection at an interface therebetween is greater than a critical angle for the total reflection in the case that the light beam directly enters the element at the light-exiting side of the light extraction layer. As compared with the related art where the light beam directly enters the element at the light-exiting side of the light extraction layer from the element at the light-entering side of the light extraction layer, in the at least one embodiment of the present disclosure, the light beam from the element at the light-entering side of the light extraction layer enters the light extraction layer and then the element at the light-exiting side of the light extraction layer. In the case that the light beams enter the light extraction layer from the element at the light-entering side of the light extraction layer, the critical angle for the total reflection increases at the interface therebetween, so more light beams may enter the light extraction layer from the element at the light-entering side of the light extraction layer, and thereby more light beams may enter the element at the light-exiting side of the light extraction layer. As a result, it is able to improve the display brightness of the OLED display device.

It should be appreciated that, Steps 701, 702 and 703 may be performed in an order on the basis of a type of the OLED display device. For example, in the case that the OLED display device is a top-emission display device, Step 701 may be performed prior to Step 702, and Step 703 may be performed in one or more of the following ways: subsequent to Step 701 and prior to Step 702, during Step 702, and subsequent to Step 702. For another example, in the case that the OLED display device is a bottom-emission OLED display device, Step 701 may be performed subsequent to Step 702, and Step 703 may be performed in one or more of the following ways: prior to Step 702, during Step 702, and subsequent to Step 702 and prior to Step 701.

For example, in Step 703, the step of forming the at least one transparent light extraction layer may include: forming the transparent light extraction layer with at least one of a light-exiting surface and a light-entering surface of the light extraction layer being a rough surface through a patterning process, and repeating this step for N−1 times so as to form N light extraction layers, wherein N being a positive integer greater than or equal to 1. For example, the step of forming two transparent light extraction layers includes forming a transparent light extraction layer with at least one of the light-exiting surface and the light-entering surface of the light extraction layer being a rough surface through a patterning process, and repeating this step again, so as to form the two transparent light extraction layers.

In the at least one embodiment of the present disclosure, in Step 703, the step of forming the at least one transparent light extraction layer may further include: forming N transparent light extraction layers with at least one of the light-exiting surfaces and the light-entering surfaces of one or more of the N transparent light extraction layers being a rough surface through a patterning process, wherein N being a positive integer greater than 1. For example, the step of forming two transparent light extraction layers includes: forming two transparent light extraction layers with the light-exiting surface of the transparent light extraction layer at the light-exiting side being a rough surface through a patterning process, or forming two transparent light extraction layers with the light-entering surfaces of the two transparent light extraction layers being rough surfaces through a patterning process.

In the at least one embodiment of the present disclosure, the step of forming the transparent light extraction layer with at least one of a light-exiting surface and a light-entering surface of the light extraction layer being a rough surface through a patterning process may include forming a transparent thermosetting material layer, curing the transparent thermosetting material layer into the transparent light extraction layer, and causing at least one of the light-exiting surface and the light-entering surface of the light extraction layer to be the rough surface by an imprinting process. For example, a transparent thermosetting resin layer may be formed by an ink-jetting process, and then heated and cured to form the transparent light extraction layer, and then at least one of the light-exiting surface and the light-entering surface of the light extraction layer may is caused to be the rough surface by the imprinting process.

In the at least one embodiment of the present disclosure, the step of forming the transparent light extraction layer with at least one of a light-exiting surface and a light-entering surface of the light extraction layer being a rough surface through a patterning process may further include: forming a transparent photocuring material layer, curing the transparent photocuring material layer into the transparent light extraction layer, and causing at least one of the light-exiting surface and the light-entering surface of the light extraction layer to be the rough surface through exposing and developing processes. For example, the transparent photocuring resin layer may be formed by a process such as printing or spin-coating, and then pre-heated and hardened through pre-heating and post-heating processes, and then exposed and developed so as to cause at least one of the light-exiting surface and the light-entering surface of the light extraction layer to be the rough surface. During the exposing process, during the exposing process, textures on the rough surface are determined by controlling an emergent direction of the light beam from a light source, and the emergent direction of the light beam from the light source is controlled in accordance with a structure and a position of a mask plate, or a light path of the light source.

In the at least one embodiment of the present disclosure, the step of forming N transparent light extraction layers with at least one of the light-exiting surfaces and the light-entering surfaces of one or more of the N transparent light extraction layers being a rough surface through a patterning process may include: forming a transparent thermosetting material layer, curing the transparent thermosetting material layer into the transparent light extraction layer, and repeating the above forming and curing steps for N−1 times to form the N transparent light extraction layers, wherein during a process of forming the N transparent light extraction layers, at least one of the light-exiting surfaces and the light-entering surfaces of one or more of the N transparent light extraction layers is caused to be the rough surface by an imprinting process.

In the at least one embodiment of the present disclosure, the step of forming N transparent light extraction layers with at least one of the light-exiting surfaces and the light-entering surfaces of one or more of the N transparent light extraction layers being a rough surface through a patterning process may further include: forming a transparent photocuring material layer, curing the transparent photocuring material layer into the transparent light extraction layer, and repeating the above forming and curing steps for N−1 times to form the N transparent light extraction layers, wherein during a process of forming the N transparent light extraction layers, at least one of the light-exiting surfaces and the light-entering surfaces of one or more of the N transparent light extraction layers is caused to be the rough surface through exposing and developing processes.

It should be appreciated that, the light extraction layer is formed at a non-packaging region of the OLED display device, and the sealant is provided at a packaging region of the OLED display device. Hence, the method further includes forming the sealant. For example, glass frit may be printed onto the first substrate, and then sintered and consolidated with the first substrate, so as to form the sealant.

The above embodiments are described in a progressive manner, and the identical or similar contents in the embodiments are not repeated, i.e., each embodiment focuses on the difference from the others. Especially, the relevant contents in the embodiments involving the method may refer to those in the embodiments involving the product.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. An organic light-emitting diode (OLED) display device, comprising an organic light-emitting layer and a plurality of elements arranged one on another at a light-exiting side of the organic light-emitting layer,
   wherein at least one transparent light extraction layer is arranged at at least one of following positions: a position between the elements, a position between the organic light-emitting layer and one of the elements adjacent to the organic light-emitting layer, and a position at a light-exiting surface of one of the elements farthest away from the organic light-emitting layer;

at least one of a refractive index of the organic light-emitting layer and a refractive index of one of the elements adjacent to the transparent light extraction layer, and a refractive index of the transparent light extraction layer decrease successively in a light emergent direction, and the refractive index of the transparent light extraction layer is greater than a refractive index of air, and the at least one transparent light extraction layer comprises a plurality of transparent light extraction layers, at least one of a light-exiting surface and a light-entering surface of each of the transparent light extraction layers is a rough surface, or the transparent light extraction layers are arranged one on another and at least one of the light-exiting surfaces and the light-entering surfaces of the transparent light extraction layers is a rough surface.

2. The OLED display device according to claim 1, wherein the rough surface is a corrugated surface.

3. The OLED display device according to claim 1, wherein the transparent light extraction layer is made of a photocuring or thermosetting material.

4. The OLED display device according to claim 3, wherein the photocuring material is photocuring resin, and the thermosetting material is thermosetting resin.

5. The OLED display device according to claim 3, wherein the photocuring material comprises polymer-dispersed liquid crystals.

6. The OLED display device according to claim 1, wherein the OLED display device is a top-emission display device, and the elements comprise, in the light emergent direction, an electron transport layer, an electron injection layer, a cathode layer and a first substrate;

wherein the at least one transparent light extraction layer is arranged at at least one of following positions: a position between the electron transport layer and the electron injection layer, a position between the electron injection layer and the cathode layer, a position between the cathode layer and the first substrate, a position between the organic light-emitting layer and the electron transport layer, and a position at a light-exiting surface of the first substrate.

7. The OLED display device according to claim 1, wherein the OLED display device is a bottom-emission display device, and the elements comprise, in the light emergent direction, a hole transport layer, a hole injection layer, an anode layer and a second substrate;

wherein the at least one transparent light extraction layer is arranged at at least one of following positions: a position between the hole transport layer and the hole injection layer, a position between the hole injection layer and the anode layer, a position between the anode layer and the second substrate, a position between the organic light-emitting layer and the hole transport layer, and a position at a light-exiting surface of the second substrate.

8. A method for manufacturing an organic light-emitting diode (OLED) display device, comprising steps of:
forming an organic light-emitting layer;
forming a plurality of elements one on another at a light-exiting side of the organic light-emitting layer; and
forming at least one transparent light extraction layer at at least one of following positions: a position between the elements, a position between the organic light-emitting layer and one of the elements adjacent to the organic light-emitting layer, and a position at a light-exiting surface of one of the elements farthest away from the organic light-emitting layer, wherein at least one of a refractive index of the organic light-emitting layer and a refractive index of one of the elements adjacent to the transparent light extraction layer, and a refractive index of the transparent light extraction layer decrease successively in a light emergent direction, and the refractive index of the transparent light extraction layer is greater than a refractive index of air, wherein the step of forming the at least one transparent light extraction layer comprises steps of:

forming the transparent light extraction layer with at least one of a light-exiting surface and a light-entering surface of the transparent light extraction layer being a rough surface through a patterning process, and repeating this step for N−1 times so as to form N transparent light extraction layers, wherein N is a positive integer greater than or equal to 1; or forming N transparent light extraction layers with at least one of the light-exiting surfaces and the light-entering surfaces of one or more of the N transparent light extraction layers being a rough surface through a patterning process, wherein N is a positive integer greater than 1.

9. The method according to claim 8, wherein the step of forming the transparent light extraction layer with at least one of a light-exiting surface and a light-entering surface of the transparent light extraction layer being a rough surface through a patterning process comprises steps of:

performing coating of a transparent thermosetting material layer, curing the transparent thermosetting material layer into the transparent light extraction layer, and causing at least one of the light-exiting surface and the light-entering surface of the transparent light extraction layer to be the rough surface by an imprinting process; or performing coating of a transparent photocuring material layer, curing the transparent photocuring material layer into the transparent light extraction layer, and causing at least one of the light-exiting surface and the light-entering surface of the transparent light extraction layer to be the rough surface through exposing and developing processes.

10. The method according to claim 8, wherein the step of forming N transparent light extraction layers with at least one of the light-exiting surfaces and the light-entering surfaces of one or more of the N transparent light extraction layers being a rough surface through a patterning process comprises steps of:

performing coating of a transparent thermosetting material layer, curing the transparent thermosetting material layer into the transparent light extraction layer, and repeating the above coating and curing steps for N−1 times to form the N transparent light extraction layers, wherein during a process of forming the N transparent light extraction layers, at least one of the light-exiting surfaces and the light-entering surfaces of one or more of the N transparent light extraction layers is caused to be the rough surface by an imprinting process; or performing coating of a transparent photocuring material layer, curing the transparent photocuring material layer into the transparent light extraction layer, and repeating the above coating and curing steps for N−1 times to form the N transparent light extraction layers, wherein during a process of forming the N transparent light extraction layers, at least one of the light-exiting surfaces and the light-entering surfaces of one or more of the N transparent light extraction layers is caused to be the rough surface through exposing and developing processes.

11. The method according to claim 9, wherein during the exposing process, textures on the rough surface are determined by controlling an emergent direction of the light beam from a light source, and the emergent direction of the light beam from the light source is controlled in accordance with a structure and a position of a mask plate, or a light path of the light source.

12. The method according to claim 10, wherein during the exposing process, textures on the rough surface are determined by controlling an emergent direction of the light beam from a light source, and the emergent direction of the light beam from the light source is controlled in accordance with a structure and a position of a mask plate, or a light path of the light source.

\* \* \* \* \*